United States Patent
Freeman et al.

(10) Patent No.: US 9,424,043 B1
(45) Date of Patent: Aug. 23, 2016

(54) FORWARD-FLOW SELECTION

(71) Applicant: ALTERA CORPORATION, San Jose, CA (US)

(72) Inventors: John Stuart Freeman, Toronto (CA); Tomasz S. Czajkowski, Toronto (CA)

(73) Assignee: Altera Corporation, San Jose, CA (US)

( * ) Notice: Subject to any disclaimer, the term of this patent is extended or adjusted under 35 U.S.C. 154(b) by 763 days.

(21) Appl. No.: 13/727,837

(22) Filed: Dec. 27, 2012

(51) Int. Cl.
*G06F 17/50* (2006.01)
*G06F 9/38* (2006.01)

(52) U.S. Cl.
CPC ........................................ *G06F 9/38* (2013.01)

(58) Field of Classification Search
USPC .......................................................... 716/116
See application file for complete search history.

(56) References Cited

U.S. PATENT DOCUMENTS

| | | | | |
|---|---|---|---|---|
| 2006/0048113 A1* | 3/2006 | Ozone | ................... | G06F 8/433 717/144 |
| 2008/0109635 A1* | 5/2008 | Shih | ...................... | G06F 9/3001 712/11 |
| 2010/0131681 A1* | 5/2010 | Reddy | .................. | G06F 13/126 710/36 |
| 2011/0016250 A1* | 1/2011 | Lee | ........................ | G11C 5/025 710/308 |

OTHER PUBLICATIONS

G. Gill, J. Hansen, and M. Singh, "Loop Pipelining for High-Throughput Streaming Computation Using Self-Timed Rings," in proceedings of the International Conference on Computer-Aided Design, Nov. 2006, pp. 289-296, San Jose, California, USA,.
OpenCL—The open standard for parallel programming of heterogeneous systems, Khronos Group.

* cited by examiner

*Primary Examiner* — Bryce Aisaka
(74) *Attorney, Agent, or Firm* — Fletcher Yoder, P.C.

(57) ABSTRACT

Systems and methods for enhancing performance of programs implemented on an integrated circuit (IC) are provided. A forward-flow selector may determine a common branch for adding a data set to and removing a data set from. By selecting a common branch for adding and removing a data set, there will be a pipeline stage for data flowing into the branch. Accordingly, the embodiments described herein enhance throughput by increasing the number of datasets that may enter a branched pipeline without stalling.

20 Claims, 3 Drawing Sheets

FORWARD-FLOW SELECTION

BACKGROUND

The present disclosure relates generally to integrated circuits, such as field programmable gate arrays (FPGAs). More particularly, the present disclosure relates to efficiently utilizing instantiated hardware implemented on the integrated circuit (e.g., an FPGA).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits (ICs) take a variety of forms. For instance, field programmable gate arrays (FPGAs) are integrated circuits that are intended as relatively general-purpose devices. FPGAs may include logic that may be programmed (e.g., configured) after manufacturing to provide any desired functionality that the FPGA is designed to support. Thus, FPGAs contain programmable logic, or logic blocks, that may be configured to perform a variety of functions on the FPGAs, according to a designer's design. Additionally, FPGAs may include input/output (I/O) logic, as well as high-speed communication circuitry. For instance, the high-speed communication circuitry may support various communication protocols and may include high-speed transceiver channels through which the FPGA may transmit serial data to and/or receive serial data from circuitry that is external to the FPGA.

In ICs such as FPGAs, the programmable logic is typically configured using low level programming languages such as VHDL or Verilog. Unfortunately, these low level programming languages may provide a low level of abstraction and, thus, may provide a development barrier for programmable logic designers. Higher level programming languages, such as OpenCL have become useful for enabling more ease in programmable logic design. The higher level programs are used to generate code corresponding to the low level programming languages. Kernels may be useful to bridge the low level programming languages into executable instructions that may be performed by the integrated circuits. Accordingly, OpenCL programs typically require at least a single hardware implementation for each kernel in the OpenCL program. In many cases, pipelining may enable more efficient execution by dividing processes into stages (e.g., a single instruction). Dividing the processes into stages may enable parallel processing by allowing new data to enter a stage immediately upon completion of processing prior data at the stage.

In traditional systems, when a loop is present, a counter typically tracks a number of data sets that are allowed to enter the loop. Maximum loop occupancy is set based upon the minimum number of stages on a branch within the loop. For example, when a loop has two branches, one with five stages and another with three, the maximum loop occupancy may be set to three, because allowing a fourth data set to enter the loop on the three-stage branch may cause a stall. Unfortunately, this approach limits throughput, because it could be possible that each branch in the loop body could accept more data. Accordingly, process efficiency is diminished using the maximum loop occupancy approach.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and devices for enhancing performance of machine-implemented programs through an improved flow of data in the body of loops found in programming of an integrated circuit (IC). In particular, the present embodiments may provide forward-flow selectors that decide which side of a branch pipeline to empty based upon the data coming into the same branch. For example, in some embodiments, a de-multiplexer that dictates a branch for entry of a data set may be selected in conjunction with a multiplexer that dictates a branch to empty. Accordingly, as datasets enter a branch of the loop body, datasets are removed from the same branch, ensuring that the pipeline is not stalled.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure relate generally to circuitry for enhancing performance of machine-readable programs implemented on an integrated circuit (IC). In particular, forward-flow selectors may be used to enhance performance (e.g., throughput) of a machine-implemented program executed on the IC. These modifications may be made based upon performance metrics or other characteristics of the machine-readable program.

Figure 1:
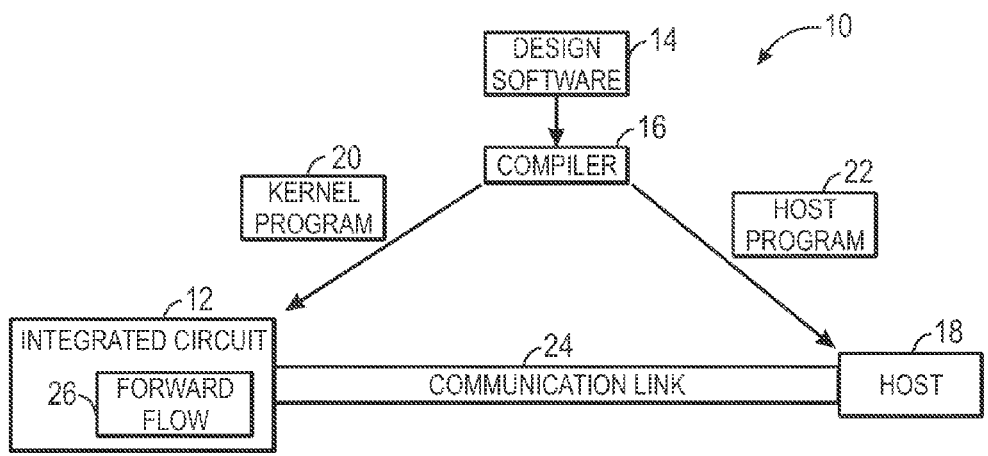
FIG. 1 is a block diagram of a system that utilizes forward-flow selectors, in accordance with an embodiment.

With the foregoing in mind, FIG. 1 illustrates a block diagram of a system 10 that includes a forward-flow selector that may provide increased throughput for a programmable design. As discussed above, a designer may desire to implement functionality on an integrated circuit 12 (IC, such as a field programmable gate array (FPGA)). The designer may specify a high level program 13 to be implemented, such as an OpenCL program, which may enable the designer to more efficiently and easily provide programming instructions to implement a set of programmable logic for the IC 12 without requiring specific knowledge of low level computer programming languages (e.g., Verilog or VHDL). For example, because OpenCL is quite similar to other high level programming languages, such as C++, designers of programmable logic familiar with such programming languages may have a reduced learning curve than designers that are required to learn unfamiliar low level programming languages to implement new functionalities in the IC.

The designers may implement their high level designs using design software 14, such as a version of Quartus by Altera™. The design software 14 may use a compiler 16 to convert the high level program into a low level program. The compiler 16 may provide machine-readable instructions representative of the high level program to a host 18 and the IC 12. For example, the IC 12 may receive one or more kernel programs 20 which describe the hardware implementations that should be stored in the IC. The host 18 may receive a host program 22 which may be implemented by the kernel programs 20. To implement the host program 22, the host 18 may communicate instructions from the host program 22 to the IC 12 via a communications link 24, which may be, for example, direct memory access (DMA) communications or peripheral component interconnect express (PCIe) communications. In some embodiments, the kernel programs 20 and the host 18 may enable enhanced throughput, through forward-flow selectors 26, which may be stored on the IC 16 and controlled by the host 18. As will be described in more detail below, the forward-flow selectors 26 may coordinate inputs and outputs of a branch within a loop body, such that execution performance may be enhanced.

Figure 2:
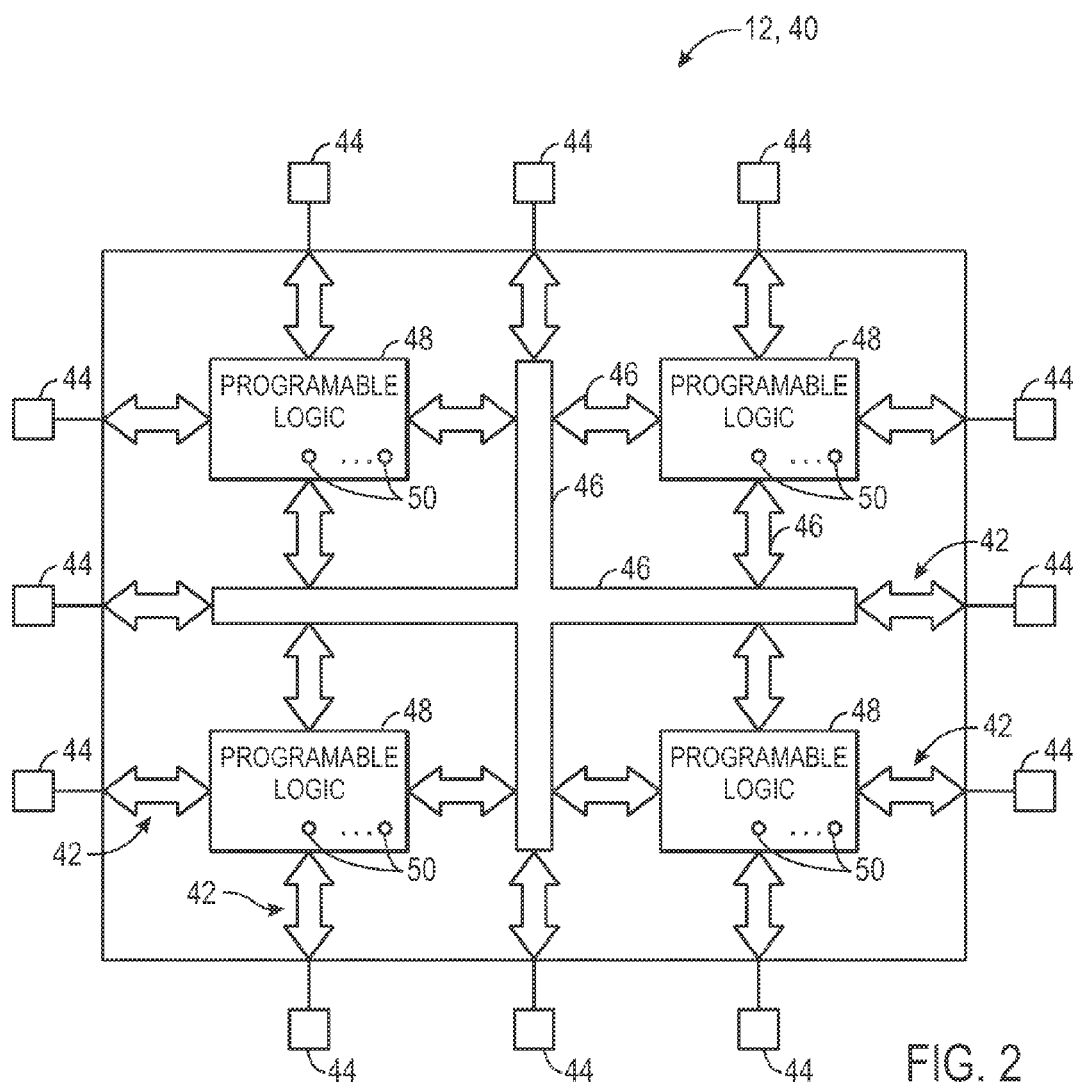
FIG. 2 is a block diagram of a programmable logic device that may include logic useful for implementing the forward-flow selectors of FIG. 1, in accordance with an embodiment.

Turning now to a more detailed discussion of the IC 12, FIG. 2 illustrates an IC device 12, which may be a programmable logic device, such as a field programmable gate array (FPGA) 40. For the purposes of this example, the device 40 is referred to as an FPGA, though it should be understood that the device may be any type of programmable logic device (e.g., an application-specific integrated circuit and/or application-specific standard product). As shown, FPGA 40 may have input/output circuitry 42 for driving signals off of device 40 and for receiving signals from other devices via input/output pins 44. Interconnection resources 46, such as global and local vertical and horizontal conductive lines and buses, may be used to route signals on device 40. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48. As discussed in further detail below, the FPGA 40 may include adaptable logic that enables partial reconfiguration of the FPGA 40, such that kernels may be added, removed, and/or swapped during the runtime of the FPGA 40.

Programmable logic devices, such as FPGA 40, may contain programmable elements 50 with the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Most programmable logic devices are electrically programmed. With electrical programming arrangements, the programmable elements 50 may be formed from one or more memory cells. For example, during programming, configuration data is loaded into the memory cells 50 using pins 44 and input/output circuitry 42. In one embodiment, the memory cells 50 may be implemented as random-access-memory (RAM) cells. The use of memory cells 50 based on RAM technology is described herein is intended to be only one example. Further, because these RAM cells are loaded with configuration data during programming, they are sometimes referred to as configuration RAM cells (CRAM). These memory cells 50 may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

The circuitry of FPGA 40 may be organized using any suitable architecture. As an example, the logic of FPGA 40 may be organized in a series of rows and columns of larger programmable logic regions, each of which may contain multiple smaller logic regions. The logic resources of FPGA 40 may be interconnected by interconnection resources 46 such as associated vertical and horizontal conductors. For example, in some embodiments, these conductors may include global conductive lines that span substantially all of FPGA 40, fractional lines such as half-lines or quarter lines that span part of device 40, staggered lines of a particular length (e.g., sufficient to interconnect several logic areas), smaller local lines, or any other suitable interconnection resource arrangement. Moreover, in further embodiments, the logic of FPGA 40 may be arranged in more levels or layers in which multiple large regions are interconnected to form still larger portions of logic. Still further, other device arrangements may use logic that is not arranged in a manner other than rows and columns.

As discussed above, the FPGA 40 may allow a designer to create a customized design capable of executing and performing customized functionalities. As mentioned above, forward-flow selectors may be incorporated into the design to reduce stalls during execution of the design, especially when there are branches within loop bodies of the design. The forward-flow selectors may be manually added by a designer using the design software, or may be automatically incorporated by the design software upon the design software determining that such functionalities would enhance the design.

Figure 3:
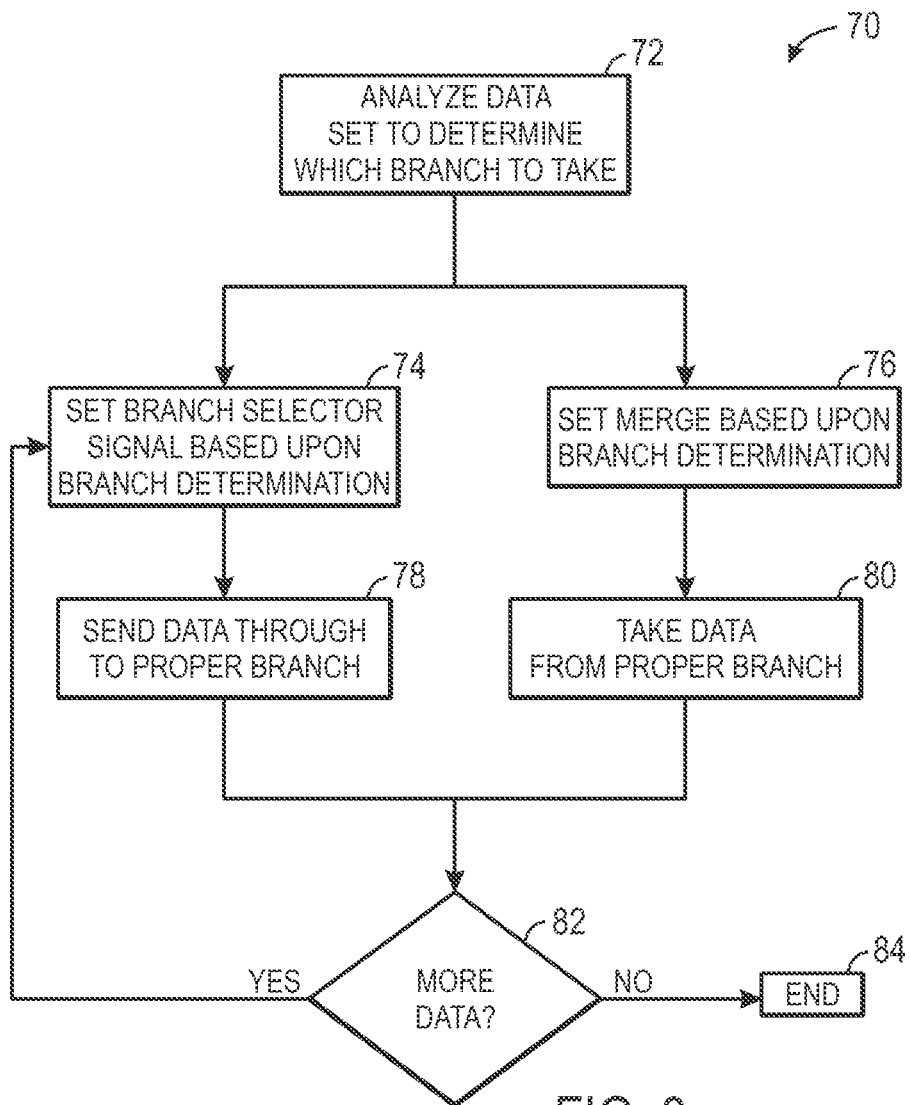
FIG. 3 is a flowchart depicting a process for forward-flow selection, in accordance with an embodiment.

Referring now to FIG. 3, a flowchart illustrating a process 70 for forward-flow selection is provided. The dataset provided to the loop may determine a branch path to take in the loop body. For example, characteristics of the dataset may dictate one branch over another branch path. Accordingly, the dataset is analyzed to determine which branch should be taken (block 72). Based upon the determined branch, a selector signal for a branching block may be set to enable data to flow to the proper branch (block 74). Additionally, based upon the same determined branch, a merge block selector signal may be set to enable data to be emptied from the same branch (block 76). Based upon the selector signals, another dataset may flow to the proper branch (block 78) and a dataset may also be emptied from the same branch (block 80). Accordingly, as a dataset is enabled to flow to a branch, a dataset is enabled to flow out of the branch, ensuring that the branch does not receive more data that it can handle (e.g., stall). Depending on whether or not there is additional data to be processed (as depicted by decision block 82), the forward-flow selection process 70 may end (block 84) or cycle back to analyze additional datasets according to block 72.

Figure 4:
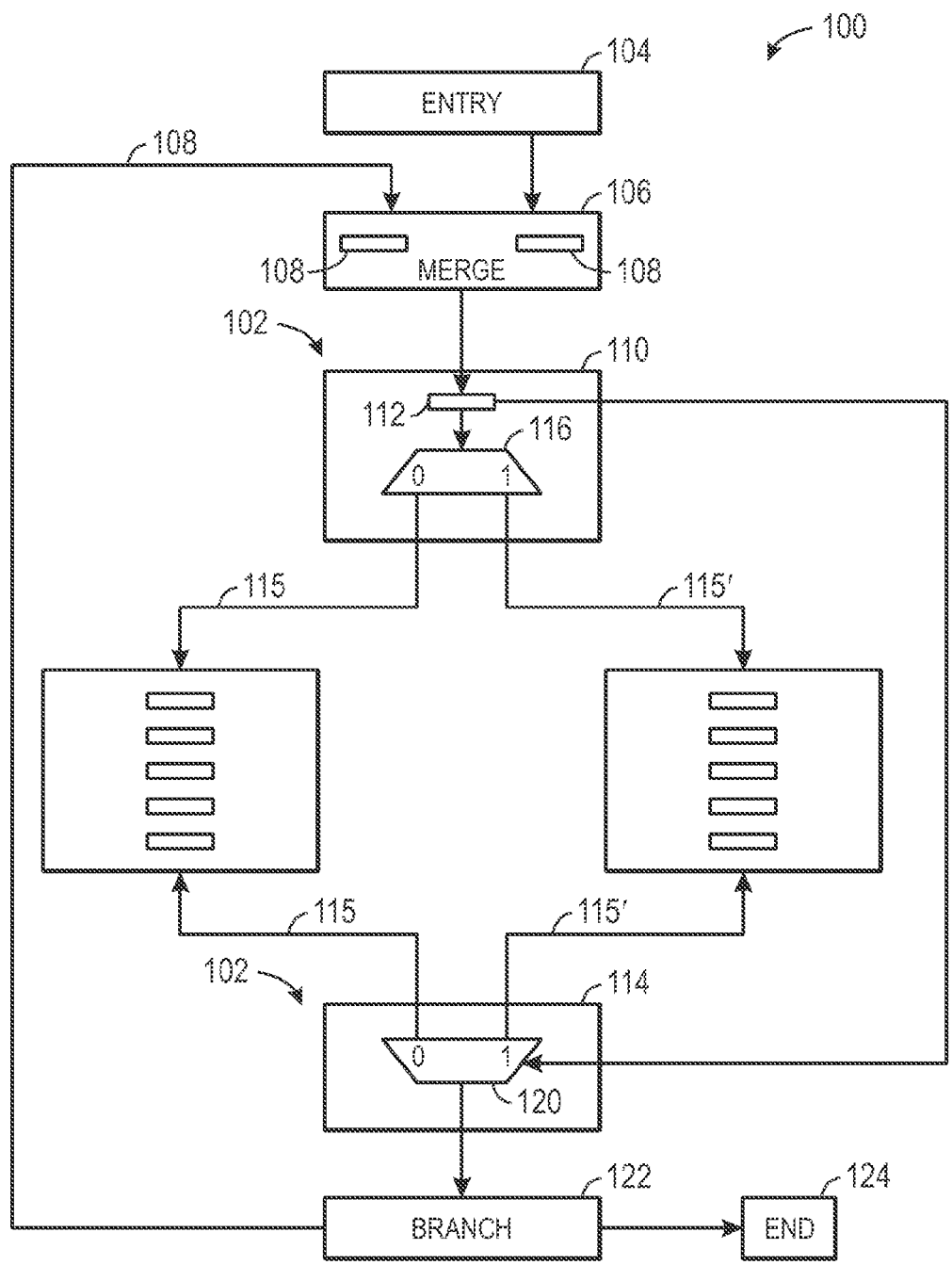
FIG. 4 is a block diagram illustrating circuitry for implementing the forward-flow selection process of FIG. 3, in accordance with an embodiment.

FIG. 4 illustrates a block diagram of circuitry 100 with implemented forward-flow selectors 102, in accordance with an embodiment. As illustrated in the current example, an entry point 104 may provide one or more datasets to a merge block 106 tasked with arbitrating datasets from the entry point 104 and a loopback 108. To do this, the merge block 160 may include staging registers 108 that receive the datasets for arbitration. The arbitrated dataset may be provided to a forward-flow selector branch block 110, which may have a register 112 that provides a branch selection signal to the forward-flow selector branch block 110 and a forward-flow selector merge block 114 tasked with emptying a dataset from a branch (e.g., 115 or 115') in the loop body. As illustrated, the register 112 supplies the selector signal to a de-multiplexer 116 of the forward-flow selector branch block 110 and a multiplexer 120 of the forward-flow selector merge block 114. Accordingly, the selector signals between these components will be coordinated. This results in a dataset being removed from the same branch 115 or 115' where a dataset is entering. Thus, stalls may be avoided by ensuring that either branch 115 or 115' will accept a new dataset as a dataset is removed, thus, never exceeding a maximum amount of data it can hold at any given clock cycle. Accordingly, it is possible to achieve a case where each pipeline stage on both branches is used. For example, in the provided example, the forward-flow selector 102 enables nine datasets to be accepted into the body of the loop without ever stalling, while traditional approaches (e.g., the maximum loop occupancy approach) would only allow three datasets to be present in the loop (e.g., as determined by the minimum number of stages in a branch, as discussed above). As may be appreciated, while nine datasets may be allowed in the optimal case of the approach discussed herein, the number of datasets that enter the loop is dependent on the actual data (e.g., characteristics of the data that determine the proper branch). In the worst case, the forward-flow selector 102 approach will at least match the efficiency of the maximum loop occupancy approach. However, this approach will exceed the efficiency of the maximum loop occupancy approach under average and/or optimal scenarios. These optimizations may be incorporated with relatively few new hardware requirements. For example, embodiments that implement the forward-flow selection logic may require only a single new register 112 in the branch block 110.

Once the forward-flow selector branch 110 and merge blocks 114 are provided with the selector signal, data may flow into a proper branch in the loop body and out of the loop body from the same branch. The branch block 122 determines whether additional iterations in the loop are needed. If no additional iterations are needed, the execution is ended 124. When additional iterations are needed, the loopback 108 provides data to the staging registers 108 in the merge block 106. The staging register 108, provided at the loopback 108, helps to ensure that a stall will not occur, by staging the data in the merge block 106 for consumption downstream. By implementing the embodied forward-flow selector 102, additional throughput may be added to the circuitry 100, requiring very little additional hardware.

As previously discussed, the forward-flow selector 102 may be implemented in the design software 14 either manually by a user or automatically by the design software 14. The design software 14 may determine that the use of such a selector 102 may make efficient use of IC resources by generating additional throughput for the circuitry 100. For example, in some embodiments, the design software 14 may identify when a forward-flow selector 102 may be used during the conversion of a high level description of a loop into a pipelined hardware description language (HDL). For example, an algorithm for such determination is provided below:

```
boolean apply_forward_flow_selector(CDFG LoopGraph,
CDFGNode start, CDFGNode end) {
    boolean result=true;
    CDFGNode current_node = start;
    if ((count_loop_entry_points(LoopGraph, start, end) > 1) ||
        (count_loop_exit_points(LoopGraph, start, end) > 1)) {
            result = false;
    } else {
        while (current_node != end) {
            if ((is_node_loop_root(current_node) &&
                (current_node != start)) {
                    if (is_loop_nested(LoopGraph, current_node)) }
                        loop_end = locate_nested_loop_end(current_node);
                        subGraph = create_sub_loop_graph(LoopGraph,
                                                current_node, loop_end);
                        subloop_result = apply_forward_flow_selector
                                            (subGraph, current_node, loop_end);
                        if (subloop_ result)
                                remove_loop_counter(current_node);
                        result &= subloop_result;
                        current_node = locate_node_after_loop(current_node);
                    } else {
                        return false;
                    }
            } else if (is_node_a_branch(current_node)) {
                CDFGNode merge_node =
                    locate_matching_merge_node( LoopGraph,
                    current_node);
                if (merge_node) {
                    left_end = merge_node->GetLeftPredecessor( );
                    left_result = apply_forward_flow_selector( LoopGraph,
                            current_node->GetLeftSuccessor( ), left end);
                    right_end = merge_node->GetRightPredecessor( );
                    right_result = apply_forwardflow_selector( LoopGraph,
                            current_node->GetRightSuccessor( ), right_end);
                    result &= left_result & right_result;
                    current_node = merge_node->GetSuccessor( );
                } else {
                    return false;
                }
            } else {
                current_node =current_node->GetSuccessor( );
            }
        }
    }
    return result;
}
```

As may be appreciated, the algorithm takes as input a control-data flow graph representing the operations performed within a loop, including exit conditions. Each node in the control-data flow graph represents an operation that may take a finite number of clock cycles to complete. Each directed edge in the control-data flow graph determines the order of operations in the graph, where a successor can only begin operation when its predecessor has finished.

Two special notes may exist in the graph, branch and merge nodes. Branch nodes control the flow of data either to one successor or to another successor, but not both. The branch notes may have up to two successors. If the intended successor is stalled, the branch node must stall as well. Merge nodes may have up to two predecessors. Each predecessor may produce valid data. However, only one data set is allowed through the merge node at a time. Accordingly, if both predecessors have valid data to provide at the same time, one of the predecessors will stall.

By providing the control-data flow graph to the algorithm described below, a modified graph that includes forward-flow selectors may be outputted. This is done by annotating branch-merge node pairs with appropriate flags (e.g., flags that denote where forward-flow selector branch and merge blocks, such as de-multiplexers and multiplexers, should be located). Also, a Boolean result is returned, denoting whether the specified loop no longer requires a counter to limit loop occupancy (e.g., true indicates that a counter is no longer needed). This outputted control-data flow graph may be used by the design software to implement the HDL for the design on the IC. Accordingly, the design software may automatically implement the forward-flow selection logic without requiring user intervention.

Through forward-flow selection optimization, design implementation on circuitry may be greatly enhanced. For example, throughput may be increased because additional datasets may be enabled to enter a loop body of the design, enabling more processing in less time.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A method for controlling a flow of data in an integrated circuit, comprising:
   determining a proper branch in the integrated circuit for a first data set based upon characteristics of the data set;
   setting a branch selector, of a forward-flow selector, in the integrated circuit via a branch selector signal based upon the proper branch, wherein the set branch selector signal enables transmission of the first data set through the proper branch; and
   setting a merge selector, of the forward-flow selector, in the integrated circuit via a merge selector signal based upon the proper branch, wherein the merge selector signal enables a second data set to be emptied from the proper branch;
   wherein the merge selector signal and the branch selector signal correspond to one another, to enable the second data set to be emptied from the proper branch as the first data set is transmitted to the proper branch.

2. The method of claim 1, comprising:
   detecting one or more sequential loops that enclose the proper branch and an alternative branch; and
   determining the proper branch, setting the branch selector signal, and setting the merge selector signal when the one or more sequential loops are detected.

3. The method of claim 1, wherein setting the branch selector signal comprises setting a selector signal on a de-multiplexer.

4. The method of claim 1, wherein setting the merge selector signal comprises setting a selector signal on a multiplexer.

5. The method of claim 1, wherein:
   setting the branch selector signal comprises setting a selector signal on a de-multiplexer;
   setting the merge selector signal comprises setting a selector signal on a multiplexer; and
   a common signal is sent to the de-multiplexer and the multiplexer to dictate a common setting between the branch selector signal and the merge selector signal.

6. The method of claim 1, comprising:
   determining the proper branch based upon the characteristics of the data set satisfying a condition in an if-then statement found in a high-level program.

7. The method of claim 1, comprising sending the first data set to the proper branch and emptying the second data set from the proper branch during a common clock cycle.

8. The method of claim 7, comprising:
   after emptying the second data set from the proper branch, branching the second data set between a downstream path and a loop back path that is upstream from the branch selector.

9. The method of claim 1, comprising:
   arbitrating the first data set, via a merge block, wherein the first data set may be sourced from a data entry point or a loop-back from a location downstream of the merge selector.

10. An integrated circuit (IC) device comprising:
    a logic design, the logic design comprising at least one forward-flow selector;
    wherein the IC is configured to: determine a proper branch in the integrated circuit for a first data set based upon characteristics of the data set; and
    wherein the at least one forward-flow selector comprises:
    a branch block, comprising a branch selector configured to send a first data set to a proper branch in the logic design based upon a selector signal that indicates the proper branch; and
    a merge block, comprising a merge selector configured to receive a second data set from the proper branch in the logic design based upon a merge selector signal comprising the selector signal.

11. The IC device of claim 10, wherein the branch block comprises a de-multiplexer configured to pass the first data set to the proper branch based upon the selector signal.

12. The IC device of claim 10, wherein the merge block comprises a multiplexer configured to accept the second data set from the proper branch based upon the selector signal.

13. The IC device of claim 10, wherein the programmable logic design comprises a sequential loop enclosing the forward-flow selector.

14. The IC device of claim 13, wherein the logic design comprises a merge block that arbitrates the first data set from a data entry point or a loopback in the sequential loop.

15. The IC device of claim 10, wherein the logic design comprises a branching block that transmits the second data set to a downstream data path or through a loopback in the sequential loop.

16. A tangible, non-transitory, computer-readable medium, comprising instructions to:
    determine a proper branch in an integrated circuit for a first data set based upon characteristics of the data set; and
    generate a forward-flow selector, wherein the forward-flow selector is configured to:

set a branch selector in the integrated circuit via a branch selector signal based upon the proper branch, wherein the set branch selector signal enables transmission of the first data set through the proper branch; and set a merge selector in the integrated circuit via a merge selector signal based upon the proper branch, wherein the merge selector signal enables a second data set to be emptied from the proper branch;

wherein the merge selector signal and the branch selector signal correspond to one another, to enable the second data set to be emptied from the proper branch as the first data set is transmitted to the proper branch.

17. The computer-readable medium of claim 16, comprising instructions to:
accept a high-level program in the form of a control-data graph that represents operations performed within a loop, including exit conditions.

18. The computer-readable medium of claim 16, comprising instructions to:
determine whether a forward-flow selector can be used by:
determining a branch node with multiple successor nodes;
determining a merge node with multiple predecessor nodes;
determining whether the branch node has exactly two successor nodes;
determining whether the merge node has exactly two predecessor nodes; and
determining that the forward-flow selector may be used only when the branch node has exactly two successor nodes and when the merge node has exactly two predecessor nodes.

19. The computer-readable medium of claim 18, comprising instructions to:
generate a modified control-data graph with flags depicting locations of the branch node and the merge node; and
generate a Boolean indicator of whether a counter to limit loop occupancy is needed when the forward flow-selector is generated.

20. The computer-readable medium of claim 19, comprising instructions to:
generate the forward-flow selector by:
determining the location of branch node and the merge node by analyzing the flags in the modified control-data graph;
generating a de-multiplexer at the location of the branch node;
generating a multiplexer at the location of the merge node;
sourcing a selector signal for the de-multiplexer and the multiplexer from data stored in a register, wherein the data is driven by characteristics of the first data set.

* * * * *